US009484615B2

(12) United States Patent
Häger

(10) Patent No.: US 9,484,615 B2
(45) Date of Patent: Nov. 1, 2016

(54) MAST ARRANGEMENT RADIO NETWORK NODE AND RELATED METHOD

(71) Applicant: TELEFONAKTIEBOLAGET L M ERICSSON (publ), Stockholm (SE)

(72) Inventor: Peter Häger, Djursholm (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 687 days.

(21) Appl. No.: 13/699,112

(22) PCT Filed: Oct. 22, 2012

(86) PCT No.: PCT/SE2012/051130
§ 371 (c)(1),
(2) Date: Nov. 20, 2012

(87) PCT Pub. No.: WO2014/065721
PCT Pub. Date: May 1, 2014

(65) Prior Publication Data
US 2014/0182811 A1 Jul. 3, 2014

(51) Int. Cl.
*H05K 5/00* (2006.01)
*H01Q 1/02* (2006.01)

(52) U.S. Cl.
CPC .................................... *H01Q 1/02* (2013.01)

(58) Field of Classification Search
CPC ............................ H01Q 1/02; H01Q 1/1242
See application file for complete search history.

(56) References Cited

U.S. PATENT DOCUMENTS 3,271,710 A * 9/1966 Leonard .................. H01F 27/06 165/45
3,859,800 A * 1/1975 Wuelpern ............... E02D 27/35 165/128
3,971,878 A * 7/1976 Huang ................... H01B 17/12 174/30
4,111,258 A * 9/1978 Jahns ...................... E02D 3/115 165/142
4,466,340 A * 8/1984 Briner .................... F23J 13/025 110/160
5,950,712 A * 9/1999 Gates ....................... F24J 3/086 165/104.34
6,094,929 A * 8/2000 Eriksson ................ H04B 1/036 361/696
6,173,537 B1 * 1/2001 Davidsson .............. E04H 12/08 343/890

(Continued)

FOREIGN PATENT DOCUMENTS

GB 2 289 827 A1 11/1995
WO WO 02/41444 5/2002

(Continued)

OTHER PUBLICATIONS

International Search Report mailed Jul. 3, 2013 in International Application No. PCT/SE2012/050784.

(Continued)

*Primary Examiner* — Steven B McAllister
*Assistant Examiner* — Jonathan Cotov

(57) ABSTRACT

A mast arrangement comprises: a mast arranged for carrying a first module of a radio network node, a holding structure adapted to receive a lower portion of the mast, and a housing for a second module of the radio network node. An air inlet channel in the mast is connected to the housing via an inlet passage, and an air outlet channel in the mast is connected to the housing via an outlet passage. An interior of the housing is arranged to direct an airflow from the inlet passage along, and/or through, the second module to the outlet passage. Further, a radio network node and a method of cooling the second module in a radio network node are provided.

23 Claims, 4 Drawing Sheets

(56) References Cited

U.S. PATENT DOCUMENTS

| | | | | |
|---|---|---|---|---|
| 6,676,122 | B1 * | 1/2004 | Wobben | F03D 9/002 290/44 |
| 6,873,303 | B2 * | 3/2005 | Creighton | H01Q 1/246 343/890 |
| 6,912,408 | B1 * | 6/2005 | O'Neill | H01Q 1/12 343/890 |
| 7,231,881 | B2 * | 6/2007 | Nelson | H01Q 1/42 114/211 |
| 8,839,848 | B2 * | 9/2014 | Wu | H05K 7/206 165/291 |
| 9,166,274 | B2 * | 10/2015 | Bennett | H01Q 1/1242 |
| 2002/0055329 | A1 * | 5/2002 | Storck, Jr. | F24F 7/06 454/186 |
| 2003/0142034 | A1 | 7/2003 | Creighton et al. | |
| 2004/0196790 | A1 | 10/2004 | Balakrishnan et al. | |
| 2007/0107647 | A1 | 5/2007 | Nelson | |
| 2008/0074841 | A1 * | 3/2008 | Curtis | G06F 1/20 361/695 |
| 2010/0295429 | A1 * | 11/2010 | Wu | H05K 7/206 312/236 |
| 2012/0208521 | A1 * | 8/2012 | Hager | H01Q 1/1242 455/422.1 |

FOREIGN PATENT DOCUMENTS

| | | |
|---|---|---|
| WO | WO 02 101960 | 12/2002 |
| WO | WO 2008 066345 | 6/2008 |

OTHER PUBLICATIONS

Written Opinion of the International Searching Authority mailed Jul. 3, 2013 in International Application No. PCT/SE2012/050784.

* cited by examiner

MAST ARRANGEMENT RADIO NETWORK NODE AND RELATED METHOD

This application is the U.S. national phase of International Application No. PCT/SE2012/051130, filed 22 Oct. 2012, which designated the U.S., the entire contents of which is hereby incorporated by reference.

TECHNICAL FIELD

The technical field relates to a mast arrangement for a radio network node. It further relates to a radio network node comprising a mast arrangement, and a method of cooling in a radio network node.

BACKGROUND

A wireless communication system arranged for wireless communication between communication units comprises a number of radio network nodes. A radio network node comprises one or more transceiver arrangements and processors comprised in what may be referred to as base station, radio network controller, Node B, or evolved Node B (eNB). Furthermore, at least one antenna is connected to such a transceiver arrangement and is required for transmitting and receiving radio signals. The antennas may for instance be arranged on an antenna mast. A variety of antenna masts have been suggested in the prior art but in practice a steel lattice mast is the most common type of mast used in a radio network node of the above mentioned kind.

Wireless communication, such as mobile internet access by means of mobile communication equipment, is demanded by more people and more devices. Thus, radio traffic within wireless communication systems increases and so does the required number of access points for the mobile communication equipment. For each access point at least one antenna is required and thus the number of antennas that are required increases with the increased demand in mobile internet access.

US 2003/0142034 discloses a telecommunications mast installation such as a base station in a cellular telephone network. A mast supports a telecommunications antenna. A foundation structure supports the mast. The foundation structure is in the form of an enclosed chamber situated at least partially underground and defining an internal space which is accessible to personnel and which accommodates electronic equipment associated with operation of the antenna. The installation includes ventilation or air conditioning means for the interior of the chamber. According to one embodiment, a ventilation circuit includes an air intake at an elevated position on the mast, an air exhaust at an elevated position on the mast, air intake ducting leading from the intake to the interior of the chamber, and air exhaust ducting leading from the interior of the chamber to the air exhaust. The mast is a hollow monopole mast with the air intake and air exhaust ducting concealed in the interior of the mast.

Since the chamber is large enough for personnel to access and to accommodate electronic equipment, it may be concluded that the chamber is ventilated or conditioned to provide a suitable temperature inside the chamber and the electronic equipment inside the chamber must be provided with suitable cooling arrangements.

WO 02/41444 discloses a communications mast assembly comprising a mast extending from a submergible communications equipment housing. The mast comprises a first inlet port for air spaced from the base of the mast, a first outlet port communicating with the inside of the housing, and a first inlet passage extending from the first inlet port to the first outlet port. The mast further comprise a second inlet port also communicating with the inside of the housing, a second outlet port spaced from the base of the mast, and a second outlet passage extending between the second inlet and the second outlet. The arrangement is such that air flows into the housing via the first inlet passage to cool the inside of the housing and heated air is extracted from the housing via the second outlet passage.

The communication equipment housing comprises a number of rooms, inter alia a ventilation and access room, and a communications equipment storage room. The first inlet passage and the second outlet passage communicate with the ventilation and access room. The communications equipment storage room is air conditioned by means of air conditioning units. Heated air from the air conditioning units is exhausted via the ventilation and access room and the mast to the atmosphere. Accordingly, the air conditioning units provide a suitable temperature inside the communications equipment storage room. Electronic receiver and transmitter equipment inside the communications equipment storage room must be provided with suitable cooling arrangements.

A high number of access points, and accordingly antennas, for wireless communication systems puts a requirement on associated antenna masts to be accepted by the public.

Providing a further function other than supporting an antenna arrangement in connection with an antenna mast, such as a street light as disclosed in the above-mentioned prior art documents, may facilitate such acceptance.

SUMMARY

An object is to provide a mast arrangement suited for installation in an urban environment.

According to an aspect, the object is achieved by a mast arrangement for a radio network node. The mast arrangement comprises:

a mast arranged for carrying a first module of the radio network node at an upper portion of the mast, the mast comprising an outer shell, and an air inlet channel and an air outlet channel arranged inside the outer shell, wherein the mast is provided with an air inlet opening communicating with the air inlet channel and an air outlet opening communicating with the air outlet channel, the air inlet opening and the air outlet opening being arranged to communicate with an ambient environment of the mast, a holding structure adapted to receive a lower portion of the mast, and a housing for a second module of the radio network node, the housing being adapted for at least partial underground installation. The air inlet channel is connected to the housing via an inlet passage. The air outlet channel is connected to the housing via an outlet passage. An interior of the housing is arranged to direct an airflow from the inlet passage along and/or through the second module to the outlet passage.

Since the interior of the housing is arranged to direct the airflow from the inlet passage, i.e. ambient air of the mast arrangement along and/or through the second module to the outlet passage, the second module is directly cooled by the airflow of ambient air passing through the housing. Thus, a compact mast arrangement comprising a mast, a holding structure for the mast, and a housing for a second module of the radio network node is accomplished. As a result, the above mentioned object is achieved.

It has been realized by the inventor that a compact mast arrangement may be achieved by the direct cooling of the second module in the housing with ambient air. Thus, the proposed mast arrangement represents a new thinking in the field of wireless communication systems in general, and specifically in a radio network node of a wireless communication system.

Furthermore, such a mast arrangement provides conditions for having a small footprint and easy install. Both these condition are important in urban environments.

The radio network node may form part of a wireless communication system. The first module may for instance comprise an antenna and/or a radio signalling unit of the radio network node. The antenna may be arranged for radio communication with wireless communication units such as mobile telephones, or portable computers of various kinds. The antenna mast may carry more than one first module. The first modules may be of different kinds. In addition to, or alternatively to, the first module mentioned above, the mast may be arranged to carry a first module comprising an antenna for a radio relay link arranged to communicate with another radio network node of the wireless communication system. The second module may comprise electronic equipment other than antennas and/or radio signalling units of the radio network node, such as a control unit of the radio network node, base band main units, transmission main unit, site controller, batteries, and/or a battery controller.

The interior of the housing being arranged to direct an airflow from the inlet passage along and/or through the second module to the outlet passage may entail the housing being provided with channels and/or walls arranged inside the housing forming passages forcing air to flow along and/or through the second module. The airflow comprises ambient air of the mast arrangement, which ambient air is arranged to directly cool the second module by flowing along and/or through the second module in the interior of the housing.

According to embodiments, the mast arrangement may comprise a fan arrangement arranged to transport air from the air inlet channel through the inlet passage, through the housing, to the outlet passage, and through the outlet passage and the air outlet channel. In this manner, an airflow through the interior of the housing for cooling the second module may be produced. The fan arrangement may comprise one or more individual fans arranged in the housing and/or the mast.

According to embodiments, the fan arrangement may be arranged to transport air through the housing, along and/or through the second module. Since the mast arrangement may comprise the fan arrangement arranged to transport air through the housing, along and/or through the second module, and the interior of the housing is arranged to direct an airflow from the inlet passage along, or through, the second module, the second module itself need not be provided with any cooling fan. Thus, the same fan arrangement which transports air through the air inlet channel, the inlet passage, the housing, the outlet passage, and the air outlet channel may transport air along and/or through the second module in order to cool the second module. Put differently, the fan arrangement of the housing may be the sole fan arrangement for cooling the second module.

According to embodiments, the air inlet opening and the air outlet opening may be provided in the mast in connection with the first module. In this manner any noise from e.g. the fan arrangement is radiated at an elevated position to the environment, from which elevated position the noise may diffuse before it is considered any disturbance.

The air inlet opening and/or the air outlet opening may be provided e.g. below and/or adjacent the first module. In the latter case, air flowing into the inlet opening may flow along the first module and thus cool the first module.

According to embodiments, the air inlet opening and the air outlet opening may be provided at a height of at least 3 meters above ground level. In this manner any noise from e.g. the fan arrangement is radiated at an elevated position to the environment, from which elevated position the noise may diffuse before it is considered any disturbance.

According to embodiments, the mast arrangement may comprise an air filter arranged in connection with the inlet passage in the housing. In this manner dust and other particles may be prevented from harming the second module.

According to embodiments, the mast may comprise an outflow opening for incoming air and an inflow opening for outgoing air at the lower portion of the mast. The outflow opening communicates with the inlet passage and the inflow opening communicates with the outlet passage. In this manner there may be provided for an airflow from the mast to the housing and back again through the outflow opening and the inflow opening.

According to embodiments, the inlet passage and the outlet passage may be formed in, or form part of, the housing. In this manner the inlet and outlet passages may be conveniently arranged to direct an airflow to and from the interior of the housing where the second module is arranged.

According to embodiments, the mast arrangement may comprise a perforated cover portion enclosing a portion of the mast at the air inlet opening and the air outlet opening. In this manner the air inlet opening and the air outlet opening may be protected by the cover portion.

According to embodiments, the mast arrangement may be arranged to extend less than 10 meters above ground level. In this manner a mast arrangement suitable for urban environment may be provided.

According to embodiments, the mast arrangement may comprise a street light armature arranged at a level above, or directly below, the first module. In this manner a mast arrangement suitable for urban environment may be provided.

According to embodiments, outer dimensions of the housing may fit within an imaginary box sized 160 cm by 120 cm by 80 cm. In this manner a housing suitable for easy installation in an urban environment may be provided. Such a housing has a small footprint and may thus, be easily be fitted underground in e.g. a sidewalk.

According to embodiments, the holding structure may be connected to, or form part of, the housing. In this manner the mast may be erected by means of the holding structure in direct union with the housing. The housing may suitably be anchored to the ground to provide a reliable foundation for the mast. Accordingly, the housing may be arranged to be secured in the ground in order to support the mast in an upright position.

According to embodiments, the holding structure may be separate from the housing and may be arranged to support the mast in an upright position. In this manner a holding structure separate from the housing may be provided, which may be advantageous in locations where the housing may not be positioned in close proximity of the mast.

A further object is to provide a radio network node suited for installation in an urban environment.

Thus, according to a further aspect there is provided a radio network node comprising a mast arrangement according to any aspect and embodiment described herein, further comprising a first module of a radio network node arranged at an upper portion of the mast and a second module of the radio network node arranged inside the housing.

According to embodiments, the first module may comprise an antenna and a radio signalling unit of the radio network node and the second module may comprise a control unit, a base band main unit, a transmission main unit, a site controller, a battery, and/or a battery controller of the radio network node.

According to embodiments, the radio network node may form part of a heterogeneous network. A heterogeneous network is typically composed of multiple radio access technologies, architectures, transmission solutions, and base stations of varying transmission power. Naturally, the radio network node may alternatively form part of a homogenous network.

A further object is to provide a method in a radio network node suited for installation in an urban environment.

Thus, according to a further aspect there is provided a method of cooling a second module of a radio network node according to any aspect and/or embodiment described herein. The method comprises:

directing air from the air inlet channel via the inlet passage into the housing and along, or through, the second module to the outlet passage and the air outlet channel.

Further features of and advantages with embodiments herein will become apparent when studying the appended claims and the following detailed description. Those skilled in the art will realize that different features of embodiments may be combined to create embodiments other than those described in the following, without departing from the scope as defined by the appended claims.

BRIEF DESCRIPTION OF THE DRAWINGS

The various aspects, including particular features and advantages, will be readily understood from the following detailed description and the accompanying drawings, in which.

DETAILED DESCRIPTION

Embodiments will now be described more fully with reference to the accompanying drawings, in which example embodiments are shown. Disclosed features of example embodiments may be combined as readily understood by one of ordinary skill in the art. Like numbers refer to like elements throughout.

Well-known functions or constructions will not necessarily be described in detail for brevity and/or clarity.

Figure 1:
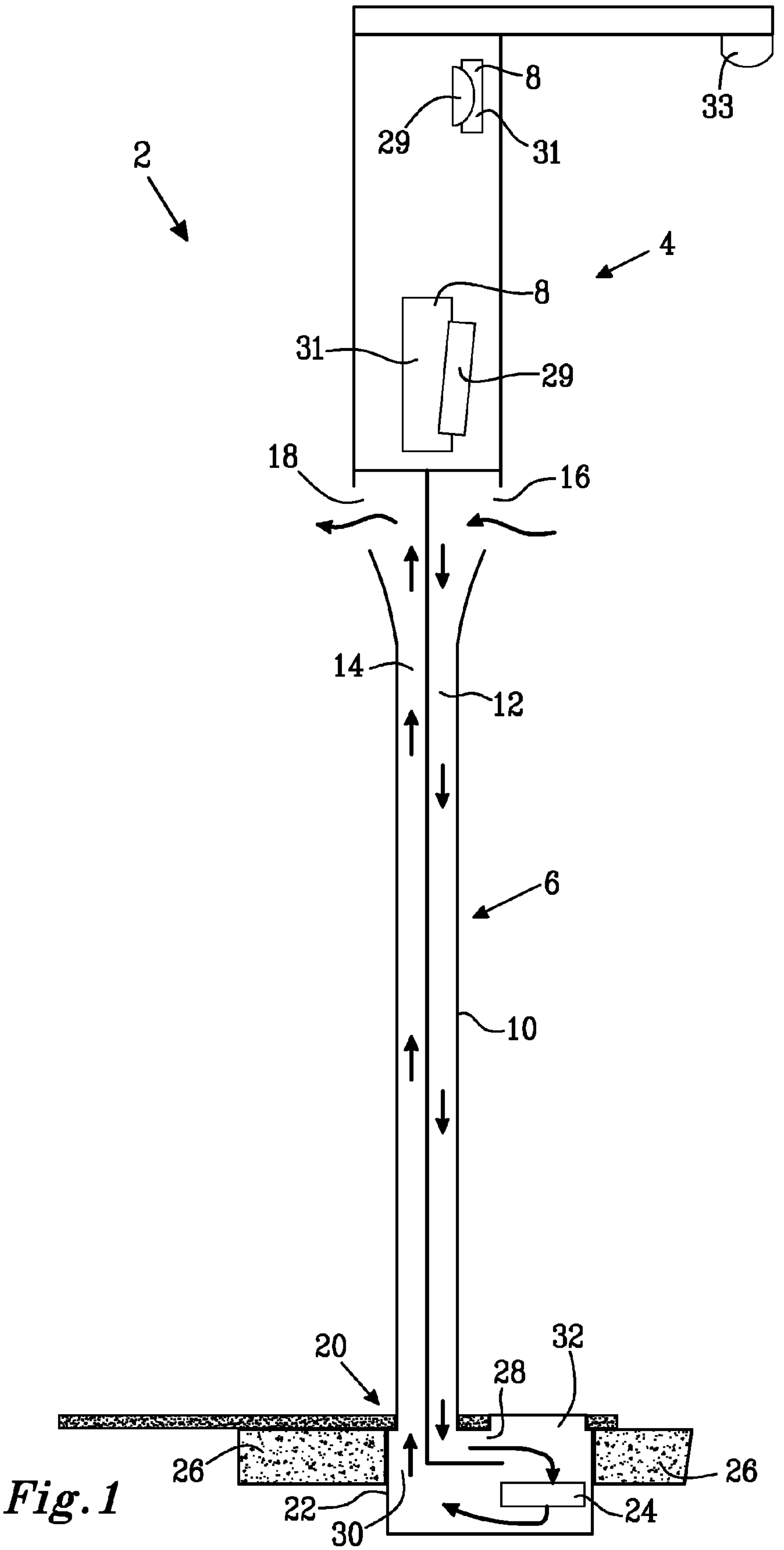
FIG. 1 illustrates schematically a mast arrangement for a radio network node, and a radio network node according to embodiments.

FIG. 1 illustrates schematically a mast arrangement 2 for a radio network node and a radio network node 4 according to embodiments. The radio network node 4 may form part of a heterogeneous network. The mast arrangement 2 comprises a mast 6 arranged for carrying a first module 8 of the radio network node 4 at an upper portion of the mast 6. In these embodiments two first modules 8 are illustrated. The mast 6 comprises an outer shell 10, an air inlet channel 12 and an air outlet channel 14 arranged inside the outer shell 10. The mast 6 is provided with an air inlet opening 16 communicating with the air inlet channel 12 and an air outlet opening 18 communicating with the air outlet channel 14. The air inlet opening 16 and the air outlet opening 18 are arranged to communicate with an ambient environment of the mast 6. The mast arrangement 2 further comprises a holding structure 20 adapted to receive a lower portion of the mast 6, and a housing 22 for a second module 24 of the radio network node 4. The housing 22 is installed substantially underground. The holding structure 20 forms part of the housing 22. The housing 22 is supported by a foundation 26, such as a concrete foundation. Alternatively, the housing 22 may be secured to the ground by means of a ground anchor, e.g. in the form of at least one steel pile. Accordingly, the housing 22 is arranged to be secured in the ground in order to support the mast 6 in an upright position. The foundation 26 may be a precast concrete slab provided with a recess or an opening for the housing 22, which precast concrete slab is positioned in, or on, the ground when the ground is prepared for installation of the mast arrangement 2 and the radio network node 4. Alternatively, the foundation 26 may be cast in situ; either with a recess or opening for the housing 22, or with the housing 22 in place during casting. In locations with low lateral stress on the mast 6, e.g. indoors or in a stadium, the foundation may be omitted and the housing be supported by the ground only.

The air inlet channel 12 is connected to the housing 22 via an inlet passage 28. The air outlet channel 14 is connected to the housing 22 via an outlet passage 30. An interior of the housing 22 is arranged to direct an airflow from the inlet passage 28 along, and/or through, the second module 24 to the outlet passage 30. The airflow through the mast arrangement 2 is indicated with arrows in FIG. 1. The interior of the housing 22 is provided with a compartment 32, which accommodates the second module 24.

A fan arrangement (not shown) may produce the airflow of ambient air through the mast arrangement 2. Thus, the second module 24 of the radio network node 4 is directly cooled by ambient air. The interior of the housing 22 may be arranged in different ways to direct the airflow along, or through, the second module 24. For instance walls of the housing 22 may be arranged to direct the airflow along, or through, the second module 24. The walls may lead the airflow towards the second module 24 or limit the space around the second module 24. Such walls may be walls forming the housing 22 and/or inner walls provided inside the housing 24. The inner walls may be e.g. partition walls in the compartment 32 and/or specific air directing walls.

The mast arrangement 2 is arranged to extend less than 10 meters above ground level and comprises a street light armature 33 arranged at a level above the first modules 8. The first module 8 may comprise an antenna 29 and a radio signalling unit 31 of the radio network node 4. The second module 24 may comprise a control unit, a base band main unit, a transmission main unit, a site controller, a battery, and/or a battery controller of the radio network node.

Figure 2:
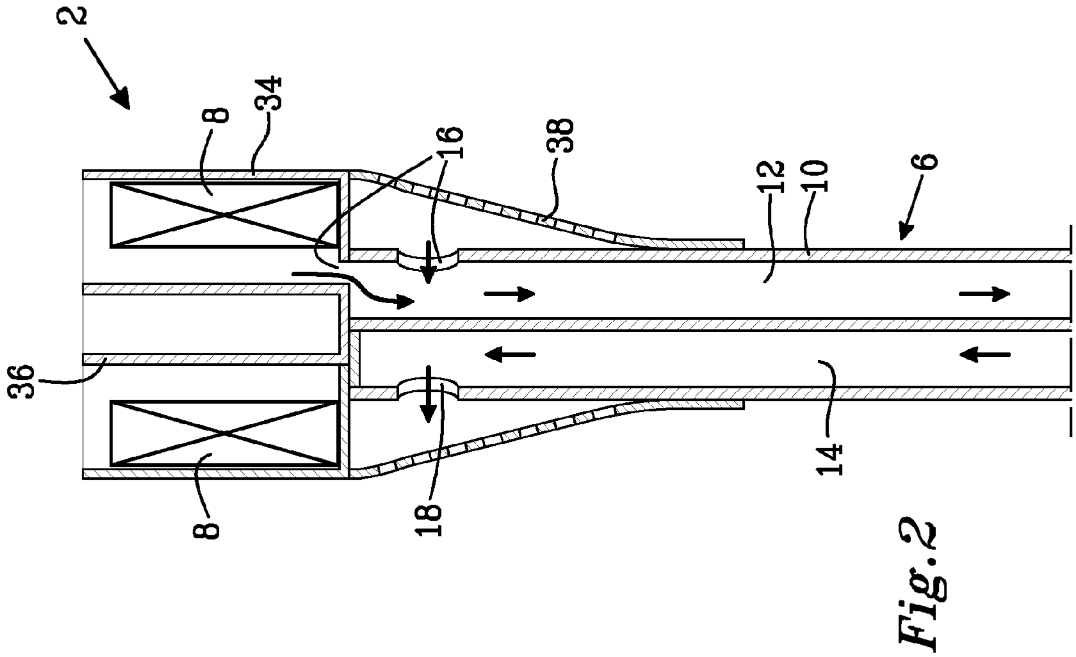
FIG. 2 illustrates a portion of a mast arrangement for a radio network node according to embodiments.

FIG. 2 illustrates a portion of a mast arrangement 2 for a radio network node according to embodiments. Again, the mast arrangement 2 comprises a mast 6 arranged for carrying a first module 8 of the radio network node 4. Two first modules 8 are illustrated in FIG. 2. The mast 6 comprises an outer shell 10, an air inlet channel 12 and an air outlet channel 14 arranged inside the outer shell 10. The mast 6 is provided with an air inlet opening 16 communicating with the air inlet channel 12 and an air outlet opening 18 communicating with the air outlet channel 14. The air inlet opening 16 and the air outlet opening 18 are arranged to communicate with an ambient environment of the mast 6. The air inlet opening 16 and the air outlet opening 18 are provided in the mast in connection with the first module 8, i.e. at an elevated position of the mast 6. For instance, the air inlet opening 16 and the air outlet opening 18 may be provided at a height of at least 3 meters above ground level. The air inlet opening 16 is provided below and adjacent the first modules 8.

The first modules 8 are covered by a radome 34 and are attached to a pole 36 of the mast 6. Air being sucked though the inlet opening 16 into the air inlet channel 12 from within the radome 34 may produce an airflow inside the radome 34. The airflow inside the radome 34 may cool one or more of the first modules 8. It may be noted that the air from inside the radome 34 flowing into the air inlet channel 12 is to be considered as ambient air, since the air inside the radome 34 originates from the ambient environment and is replaced with ambient air as it flows into the air inlet channel 12. A perforated cover portion 38 encloses a portion of the mast 6 at the air inlet opening 16 and the air outlet opening 18. The perforate cover portion 38 prevents e.g. birds from accessing the air inlet and air outlet openings 16, 18.

Figure 3A:
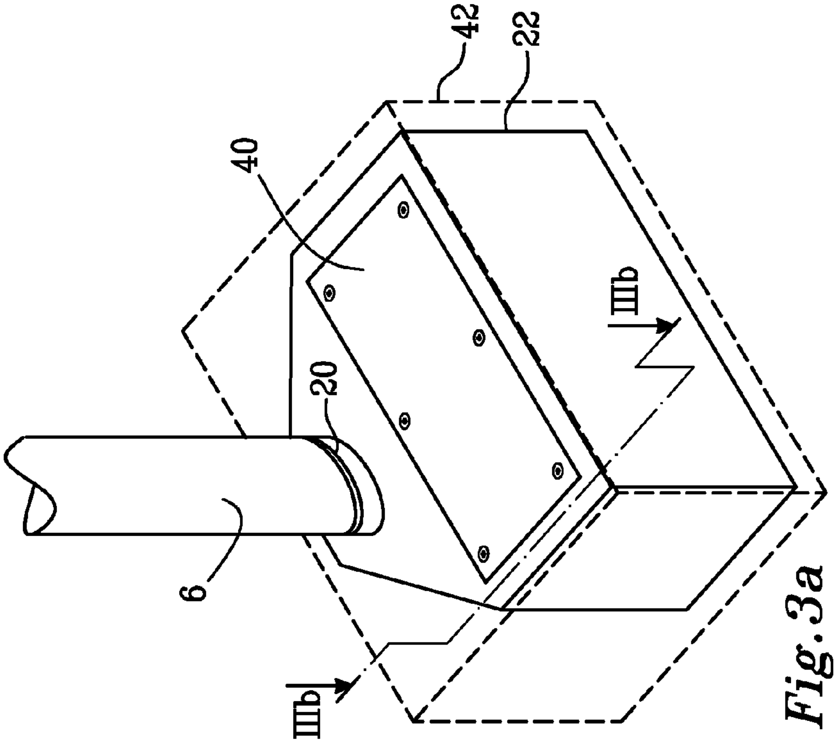
FIGS. 3*a* and 3*b* illustrate a housing, and a cross section through the housing, of a mast arrangement of a radio network node according to embodiments.
Figure 3B:
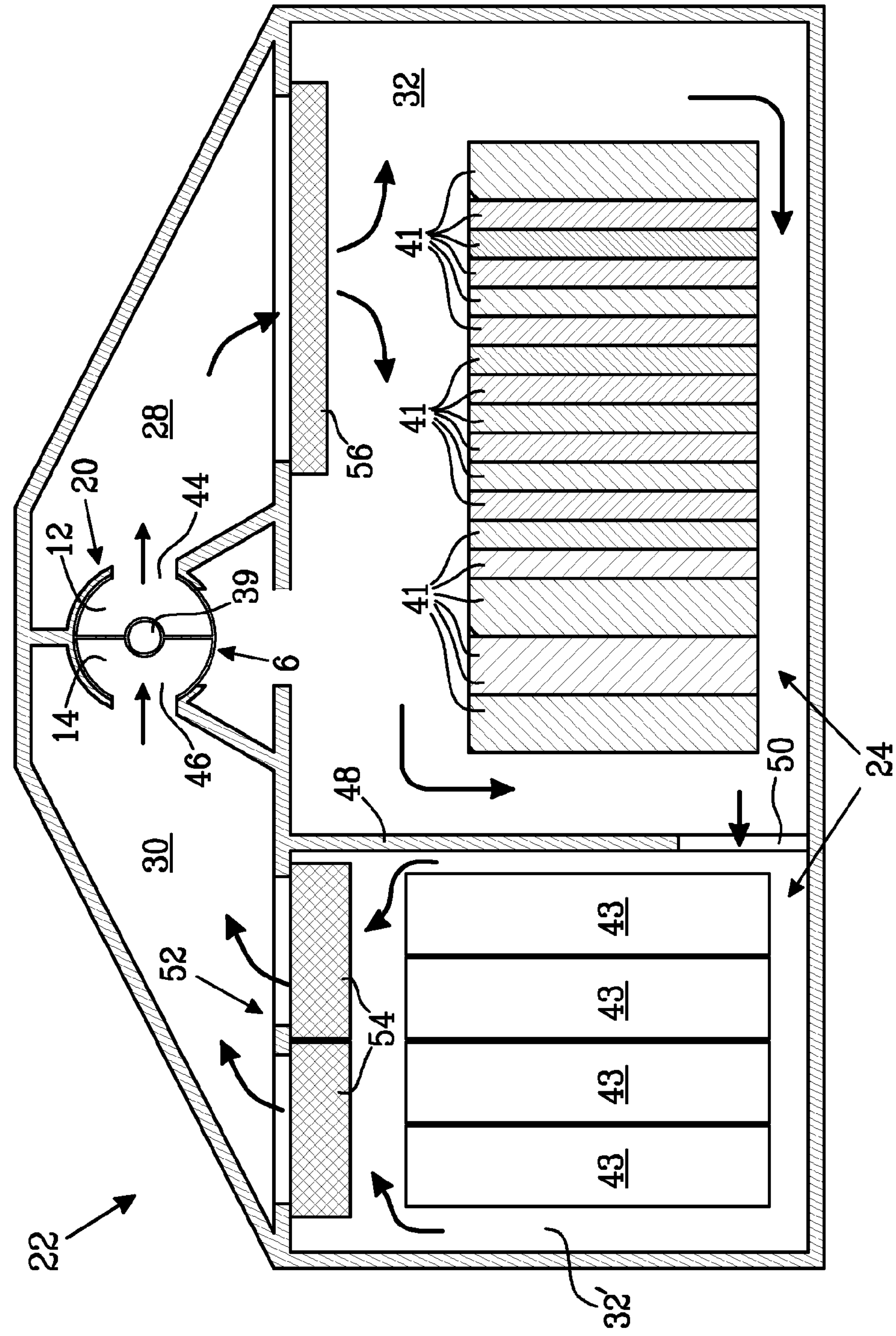

FIGS. 3*a* and 3*b* illustrate a housing 22, and a cross section through the housing 22, of a mast arrangement of a radio network node according to embodiments. The mast arrangement comprises a mast 6 arranged for carrying a first module of the radio network node. The mast 6 comprises an outer shell 10, an air inlet channel 12 and an air outlet channel 14 arranged inside the outer shell 10. The air inlet and air outlet channels 12, 14 communicate with respective air inlet and air outlet openings arranged e.g. at least 3 meters above ground level. The mast 6 is provided with a cable channel 39 for running cables to and from the first module as well as to any further equipment supported by the mast 6, such as e.g. a street light. The housing 22 comprises a holding structure 20 adapted to receive a lower portion of the mast 6. The housing 22 is installed substantially underground and the holding structure 20 forms part of the housing 22. The holding structure 20 forms a mast channel having an inner diameter permitting a lower portion of the mast 6 to be inserted into the mast channel and supporting the mast 6. The housing 22 is suitably supported by a foundation. Accordingly, the housing 22 is arranged to be secured in the ground in order to support the mast 6 in an upright position. The housing 22 is provided with two compartments 32, 32', inside which second modules 24 of the radio network node are arranged. One of the second modules 24 may for instance comprise control equipment 41 of the radio network node such as a control unit, a base band main unit, a transmission main unit, a site controller. The other second module 24 may comprise power components 43 of the radio network node such as batteries and battery controller. A lid 40 is provided to close an opening of the housing 22. The lid 40 may be removed such that service personnel may access the interior of the housing 22. The housing 22 fits within an imaginary box 42 sized 160 cm by 120 cm by 80 cm. Thus, personnel may access the open housing 22 and the second modules 24 from the ground level without entering the housing 22. In any event the housing 22 is too small for personnel to enter when the compartments 32, 32' are fitted with the second modules 24.

The air inlet channel 12 of the mast 6 is connected to the housing 22 via an inlet passage 28. An outflow opening 44 of the mast 6 communicates with the inlet passage 28. The air outlet channel 14 is connected to the housing 22 via an outlet passage 30. The mast 6 comprises an inflow opening 46 communicating with the outlet passage 30. The inlet passage 28 and the outlet passage 30 are formed in the housing 22. The interior of the housing 22 is arranged to direct an airflow from the inlet passage 28 along, and/or through, the second modules 24 to the outlet passage 30. The airflow through the housing 22 is indicated with arrows in FIG. 3*b*. In these embodiments, the interior of the housing 22 is arranged to direct an airflow along, and/or through, the second modules 24 by means of the inlet and outlet passages 28, 30 being arranged at opposite ends of the housing 22, a partition wall 48 being arranged inside the housing 22 dividing its interior into the two compartments 32, 32', and a passage opening 50 being provided opposite to the inlet and outlet passages 28, 30 in the partition wall 48.

A fan arrangement 52 is arranged between the compartments 32, 32' and the outlet passage 30. The fan arrangement 52 comprises two fans 54. The fan arrangement 52 forces air from the compartments 32, 32' into the outlet passage 30 and the air outlet channel 14. Thus, the fan arrangement 52 is also arranged to transport air from the air inlet channel 12 through the inlet passage 28, through the housing 22 and the compartments 32, 32' thereof to the outlet passage 30. In this manner an airflow of ambient air through the interior of the housing 22 for cooling the second module 24 is produced. Accordingly, the fan arrangement 52 is arranged to transport air through the housing, along and/or through the second module 24. The second module 24 itself need not be provided with any cooling fan. Put differently, the fan arrangement 52 of the housing 22 is the sole fan arrangement for cooling the second module 24. To prevent dust and dirt from soiling the second module 24, an air filter 56 is arranged in connection with the inlet passage 28 in the housing 22. The air filter 56 may be removed for cleaning or to be exchanged when the lid 40 is opened.

Figure 4:
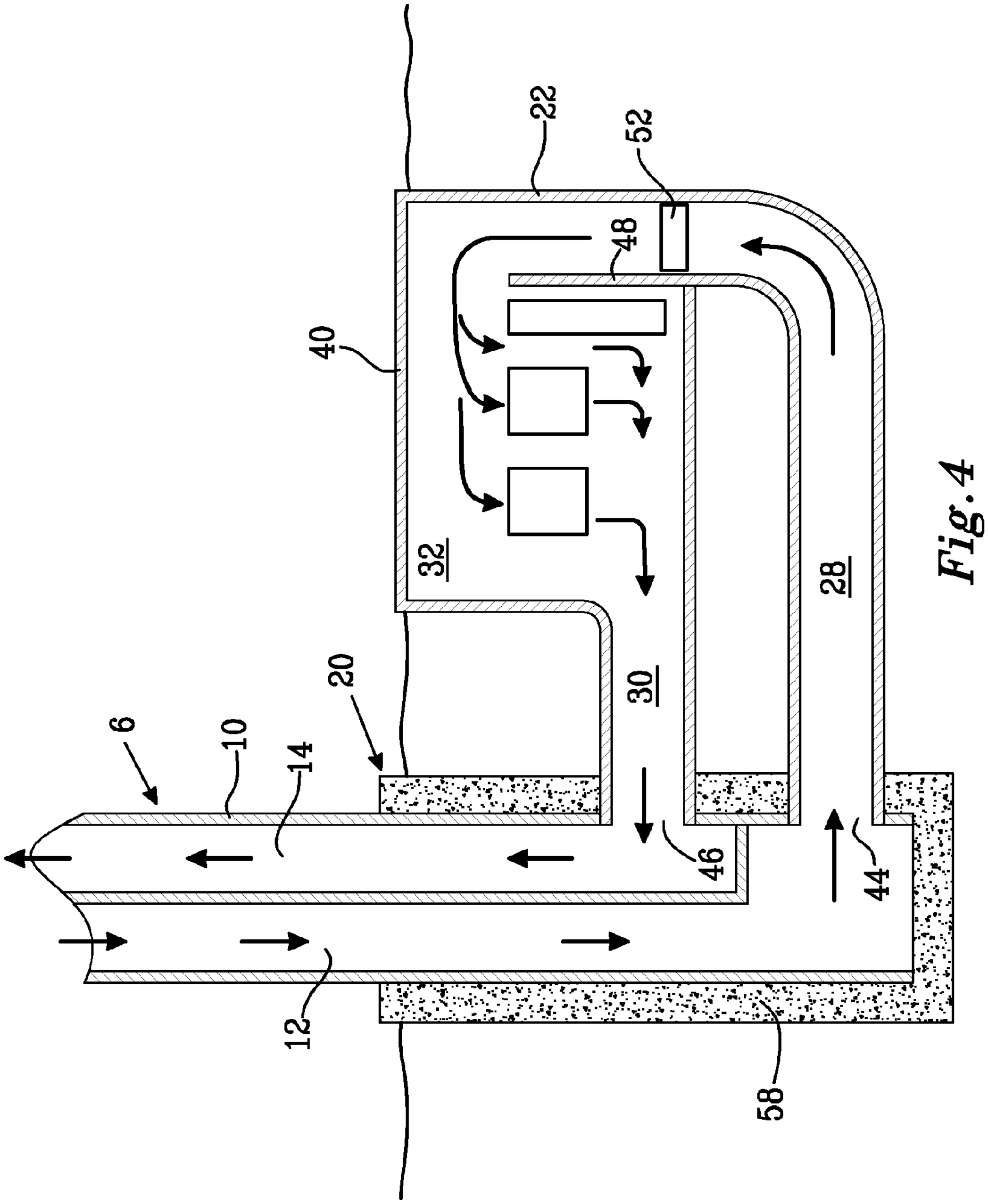
FIG. 4 illustrates a cross section through a housing and a holding structure of a mast arrangement of a radio network node according to embodiments.

FIG. 4 illustrates a cross section through a housing 22 and a holding structure 20 of a mast arrangement of a radio network node according to embodiments. The mast arrangement comprises a mast 6 arranged for carrying a first module of the radio network node. The mast 6 comprises an outer shell 10, an air inlet channel 12 and an air outlet channel 14 arranged inside the outer shell 10. The air inlet and outlet channels 12, 14 communicate with respective air inlet and air outlet openings arranged e.g. at least 3 meters above ground level. The holding structure 20 is separate from the housing 22 and supports the mast 6 in an upright position. The holding structure 20 is adapted to receive a lower portion of the mast 6. The holding structure 20 comprises a foundation in the form of a concrete tube 58. The concrete tube 58 forms a mast channel having an inner diameter permitting the lower portion of the mast 6 to be inserted into the mast channel and supporting the mast 6.

The housing 22 is installed underground. In these embodiments, a light foundation or thoroughly preparation of the ground may suffice to support the housing 22. The housing 22 is provided with a compartment 32, inside which a second module 24 of the radio network node is arranged. Again, personnel may access an interior of the housing 22 and the second module 24 from the ground level via a lid 40 without entering the housing 22.

The air inlet channel 12 of the mast 6 is connected to the housing 22 via an inlet passage 28. An outflow opening 44 of the mast 6 communicates with the inlet passage 28. The air outlet channel 14 is connected to the housing 22 via an outlet passage 30. The mast 6 comprises an inflow opening 46 communicating with the outlet passage 30. In these embodiments, the inlet passage 28 and the outlet passage 30 are formed by tubes or pipes separate from the housing 22. The interior of the housing 22 is arranged to direct an airflow from the inlet passage 28 through the second module 24 to the outlet passage 30. Components of the second module 24 are arranged at a distance from each other to permit the airflow through the second module 24. The airflow through the mast 6 and the housing 22 is indicated with arrows. In these embodiments, the interior of the housing 22 is arranged to direct the airflow through the second module 24 by means of the inlet and an outlet passages 28, 30 being arranged on opposite sides of a partition wall 48 arranged inside the housing 22.

A fan arrangement 52 is arranged in the housing close to the inlet passage 28. The fan arrangement 52 forces ambient air from the air inlet channel 12 into the housing 22. Thus, the fan arrangement 52 is also arranged to transport air through the housing 22 through the outlet passage 30 and the air outlet channel 14 to the ambient environment of the mast arrangement. In this manner an airflow of ambient air through the interior of the housing 22 for cooling the second module 24 is produced. Again, the second module 24 itself need not be provided with any cooling fan. Put differently, the fan arrangement 52 of the housing 22 is the sole fan arrangement for cooling the second module 24. To prevent dust and dirt from soiling interior of the housing 22 and the second module 24, an air filter (not shown) may be arranged in connection with the inlet passage 28 in the housing 22.

Figure 5:
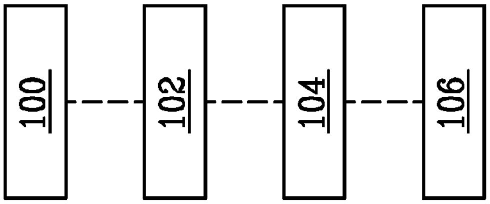
FIG. 5 is a schematic flow chart that illustrates embodiments of a method of cooling a second module of a radio network node.

FIG. 5 illustrates embodiments of a method of cooling a second module 24 of a radio network node 4 according to any aspect and/or embodiment described herein. The method comprises:

directing 100 air from the air inlet channel 12 via the inlet passage 28 into the housing 22 and along, or through, the second module 24 to the outlet passage 30 and the air outlet channel 14.

According to embodiments the method may comprise:

admitting 102 air from the air inlet opening 16 at least 3 meters above ground level into the air inlet channel 12, and discharging 104 air from the air outlet opening 18 at least 3 meters above ground level.

According to embodiments the method may comprise:

running 106 the fan arrangement 52 to produce an airflow through the air inlet channel 12, along or through the second module 24 in the interior of the housing 22, and through the air outlet channel 14.

Example embodiments described above may be combined as understood by a person skilled in the art. Further, it may be mentioned purely as an example that the second module/s 24 may produce approximately 800 W in total of heating power, which is to be cooled by ambient air flowing through the housing 22 along and/or through the second module 24. To achieve this it is estimated that an airflow of 70 litres/second of ambient air at a temperature of up to 50 degrees Celsius is to be produced by the fan arrangement 52. The fan arrangement 52 may be temperature controlled based on a temperature related to the second module 24. The mast 6 may have a diameter of at least 200 mm and each one of the air inlet channel 12 and the air outlet channel 14 may have a through flow area of at least 1200-1600 $mm^2$. Although reference has been made to example embodiments, many different alterations, modifications and the like will become apparent for those skilled in the art. Therefore, it is to be understood that the foregoing is illustrative of various example embodiments and that the invention is defined only the appended claims.

As used herein, the term "comprising" or "comprises" is open-ended, and includes one or more stated features, elements, steps, components or functions but does not preclude the presence or addition of one or more other features, elements, steps, components, functions or groups thereof.

The invention claimed is:

1. A mast arrangement for a radio network node, the mast arrangement comprising:

a mast arranged for carrying a first module of the radio network node at an upper portion of the mast, the mast comprising an outer shell, and an air inlet channel and an air outlet channel arranged inside the outer shell, wherein the mast is provided with an air inlet opening communicating with the air inlet channel and an air outlet opening communicating with the air outlet channel, the air inlet opening and the air outlet opening being arranged to communicate with an ambient environment of the mast, a holding structure adapted to receive a lower portion of the mast, and a housing for a second module of the radio network node, the housing being adapted for at least partial underground installation such that the second module is located below ground level, the second module comprising electronic components of the radio network node, wherein, the air inlet channel is connected to the housing via an inlet passage configured to direct an airflow to an interior of the housing, and the air outlet channel is connected to the housing via an outlet passage, and wherein the interior of the housing comprises one or more interior walls configured to direct the airflow from the inlet passage along, and/or through, the second module to the outlet passage.

2. The mast arrangement according to claim 1, comprising a fan arrangement arranged to transport air from the air inlet channel through the inlet passage, through the housing, to the outlet passage, and through the outlet passage and the air outlet channel.

3. The mast arrangement according to claim 2, wherein the fan arrangement is arranged to transport air through the housing, along or through the second module.

4. The mast arrangement according to claim 1, wherein the air inlet opening and the air outlet opening are provided in the mast substantially directly below the first module.

5. The mast arrangement according to claim 1, wherein the air inlet opening and the air outlet opening are provided at a height of at least 3 meters above ground level.

6. The mast arrangement according to claim 1, comprising an air filter arranged in connection with the inlet passage in the housing.

7. The mast arrangement according to claim 1, wherein the mast comprises an outflow opening for incoming air and an inflow opening for outgoing air at the lower portion of the mast, the outflow opening communicating with the inlet passage and the inflow opening communicating with the outlet passage.

8. The mast arrangement according to claim 1, wherein the inlet passage and the outlet passage are formed in, or form part of, the housing.

9. The mast arrangement according to claim 1, comprising a perforated cover portion enclosing a portion of the mast at the air inlet opening and the air outlet opening.

10. The mast arrangement according to claim 1, wherein the mast arrangement is arranged to extend less than 10 meters above ground level.

11. The mast arrangement according to claim 1, comprising a street light armature arranged at a level above, or directly below, the first module.

12. The mast arrangement according to claim 1, wherein outer dimensions of the housing are 160 cm or less in a first direction, 120 cm or less in a second direction, and 80 cm or less in a third direction, wherein the first, second and third directions are mutually orthogonal.

13. The mast arrangement according to claim 1, wherein the holding structure is connected to, or forms part of, the housing.

14. The mast arrangement according to claim 13, wherein the housing is arranged to be secured in the ground in order to support the mast in an upright position.

15. The mast arrangement according to claim 1, wherein the holding structure is separate from the housing and is arranged to support the mast in an upright position.

16. The mast arrangement according to claim 1, wherein the one or more interior walls are arranged to limit the space around the second module.

17. The mast arrangement according to claim 1, wherein a temperature of the airflow that is directed to the interior of the housing via the inlet passage is approximately equal to the ambient environment at the air inlet opening.

18. A radio network node comprising:

a first module of a radio network node arranged at an upper portion of a mast;

the mast comprising:

an outer shell, an air inlet channel, an air outlet channel arranged inside the outer shell, an air inlet opening communicating with the air inlet channel, an air outlet opening communicating with the air outlet channel, wherein the air inlet opening and the air outlet opening are arranged to communicate with an ambient environment of the mast, a holding structure adapted to receive a lower portion of the mast, and a second module of the radio network node arranged inside a housing configured to be installed at least partially underground such that the second module is located below ground level, the second module comprising electronic components of the radio network node, wherein the air inlet channel is connected to the housing via an inlet passage configured to direct an airflow to an interior of the housing, and the air outlet channel is connected to the housing via an outlet passage, and wherein the interior of the housing comprises one or more interior walls configured to direct the airflow from the inlet passage along, and/or through, the second module to the outlet passage.

19. The radio network node according to claim 18, wherein the first module comprises an antenna and a radio signaling unit of the radio network node and the second module comprises a control unit, a base band main unit, a transmission main unit, a site controller, a battery, and/or a battery controller of the radio network node.

20. The radio network node according to claim 18, wherein the radio network node forms part of a heterogeneous network.

21. The radio network node according to claim 18 wherein the air inlet channel and the inlet passage are configured to direct air into the housing and along, or through, the second module to the outlet passage and the air outlet channel.

22. The radio network node according to claim 21, wherein:

the air inlet opening is configured to admit air at least 3 meters above ground level into the air inlet channel, and the air outlet opening is configured to discharge air at least 3 meters above ground level.

23. The radio network node according to claim 21, the fan arrangement is configured to produce an airflow through the air inlet channel, along or through the second module in the interior of the housing, and through the air outlet channel.

* * * * *